(12) United States Patent
Nomura et al.

(10) Patent No.: US 7,307,940 B2
(45) Date of Patent: Dec. 11, 2007

(54) OPTICAL PICK-UP DEVICE

(75) Inventors: Ryoji Nomura, Kanagawa (JP); Hiroko Abe, Kanagawa (JP); Mikio Yukawa, Kanagawa (JP); Yasuyuki Arai, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 578 days.

(21) Appl. No.: 10/878,497

(22) Filed: Jun. 29, 2004

(65) Prior Publication Data

US 2005/0025025 A1    Feb. 3, 2005

(30) Foreign Application Priority Data

Jun. 30, 2003    (JP) ............... 2003-189054

(51) Int. Cl.
*G11B 7/00*    (2006.01)
(52) U.S. Cl. ............ 369/121; 369/116; 369/112.01; 369/44.11
(58) Field of Classification Search ............ None
See application file for complete search history.

(56) References Cited

U.S. PATENT DOCUMENTS

| | | | |
|---|---|---|---|
| 4,937,808 A * | 6/1990 | Shimada et al. ........ 369/112.24 |
| 5,262,654 A | 11/1993 | Yamazaki | |
| 5,881,089 A | 3/1999 | Berggren et al. | |
| 6,087,648 A | 7/2000 | Zhang et al. | |
| 6,111,902 A | 8/2000 | Kozlov et al. | |
| 6,246,644 B1 | 6/2001 | Seo | |
| 6,262,441 B1 | 7/2001 | Böhler et al. | |
| 6,274,861 B1 | 8/2001 | Zhang et al. | |
| 6,330,262 B1 | 12/2001 | Burrows et al. | |

(Continued)

FOREIGN PATENT DOCUMENTS

DE    101 62 783    7/2003

(Continued)

OTHER PUBLICATIONS

Nir Tessler, "Laser Based on Semiconducting Organic Materials," Advanced Materials, 1999, 11, No. 5, pp. 363-370.

(Continued)

*Primary Examiner*—Muhammad Edun
(74) *Attorney, Agent, or Firm*—Eric J. Robinson; Robinson Intellectual Property Law Office, P.C.

(57) ABSTRACT

It is an object of the present invention to provide an optical pick-up device capable of being miniaturized by reducing the number of components. The present invention provides an optical pick-up device including a light-emitting device having an organic compound that emits laser light upon applying current. The light-emitting device interposes an organic compound layer between a pair of electrodes. The organic compound layer, which is a main component, has a layer configuration for emitting a laser beam. In the layer configuration, the thickness of each layer is determined in consideration of the wavelength of laser oscillation. The organic compound layer is composed of a plurality of layers, each of which has different properties such as carrier transportation properties or light-emitting properties. The organic compound layer is preferably formed to have a so-called resonator structure formed via a reflecting layer.

30 Claims, 7 Drawing Sheets

U.S. PATENT DOCUMENTS

| | | |
|---|---|---|
| 6,399,933 B2 | 6/2002 | Zhang et al. |
| 6,452,212 B1 | 9/2002 | Codama et al. |
| 6,724,012 B2 | 4/2004 | Kimura |
| 6,939,012 B2 | 9/2005 | Cok et al. |
| 2001/0036142 A1* | 11/2001 | Kadowaki et al. .......... 369/116 |
| 2002/0009274 A1 | 1/2002 | Gharavi |
| 2003/0103537 A1 | 6/2003 | Taniguchi et al. |
| 2003/0219058 A1 | 11/2003 | Kahen et al. |
| 2004/0190584 A1 | 9/2004 | Spoonhower et al. |
| 2005/0008052 A1 | 1/2005 | Nomura et al. |
| 2005/0122880 A1* | 6/2005 | Tatsuno et al. ............... 369/99 |

FOREIGN PATENT DOCUMENTS

| | | |
|---|---|---|
| JP | 11-16197 | 1/1999 |
| JP | 11-45453 | 2/1999 |
| JP | 2000-058259 | 2/2000 |

OTHER PUBLICATIONS

O'Brien et al., *Improved Energy Transfer in Electrophosphorescent Devices*, Applied Physics Letters, vol. 74, No. 3, Jan. 18, 1999, pp. 442-444.

Baldo et al., *Prospects for Electrically Pumped Organic Lasers*, Physical Review B, vol. 66, 2002, pp. 035321-1-16.

Kozlov et al., *Study of Lasing Action Based on Förster Energy Transfer in Optically Pumped Organic Semiconductor Thin Films*, Journal of Applied Physics, vol. 84, No. 8, Oct. 15, 1998, pp. 4096-4108.

* cited by examiner

OPTICAL PICK-UP DEVICE

BACKGROUND OF THE INVENTION

1. Field of the Invention

This invention relates to an optical pick-up device for input and output of information recorded in an optical record medium such as an optical disk; and an electric appliance using the optical pick-up device.

2. Related Art

An optical pick-up device for reading out information recorded in an optical record medium that records information such as music, movie, or the like is used for various electric appliances such as a computer.

An optical pick-up device emits a laser beam to a recording surface of an optical record medium. As a laser beam scans the recording surface, information is read out sequentially by receiving a reflected light from the record medium by a detector. An optical pick-up device is known as the one that is composed of a base incorporated with discrete components such as a semiconductor laser, a prism, a mirror, an objective lens, a photoelectric conversion element, and the like. For example, refer to Unexamined Patent Publication No. 11-16197 (U.S. Pat. No. 6,246,644).

However, the conventional optical pick-up device is a high-precision processing product that is completed by assembling dozens of or hundreds of components. As mentioned above, since a plurality of components is incorporated thereto, the conventional optical pick-up device has a limitation of miniaturization. Accordingly, electric appliances installed with the conventional optical pick-up device are subject to restrictions in being miniaturized and lightweight. For example, a reproduction device of an optical record medium is often separately sold from the main body of a laptop computer which has the selling point of thin and weight-saving.

SUMMARY OF THE INVENTION

In view of the foregoing, it is an object of the present invention to provide an optical pick-up device capable of being miniaturized by reducing the number of components.

The present invention provides an optical pick-up device comprising a light-emitting device that emits a laser beam upon applying current. In the light-emitting device included in the optical pick-up device, an organic compound layer is interposed between a pair of electrodes. The organic compound layer, which is a main component, has a layer configuration for emitting a laser beam. In the layer configuration, the thickness of each layer is determined in consideration of the wavelength of laser oscillation.

As used herein, the term "organic compound layer" is a generic term used to refer to a thin film containing mainly an organic compound formed between a pair of electrodes. The organic compound layer is formed to be interposed between a pair of electrodes. The organic compound layer is composed of a plurality of layers, each of which has different properties such as carrier transportation properties or light-emitting properties. The organic compound layer is preferably formed to have a so-called resonator structure formed via a reflecting layer.

An optical pick-up device comprises: a light-emitting device capable of emitting a laser beam; a photodetector for receiving a reflected light from a record medium to convert the reflected light to an electric signal, wherein the reflected light is formed by an irradiation the laser beam from the light-emitting device to the record medium; and a signal processing circuit unit comprising a transistor, and the light-emitting device, the photodetector, and the signal processing circuit are formed over a same substrate.

An optical pick-up device comprises: a light-emitting device capable of emitting a laser beam; an optical system for condensing the laser beam emitted from the light-emitting device to irradiate a record medium, and for introducing a reflected light from the record medium to a photodetector; the photodetector for receiving the reflected light from the record medium to convert the reflected light to an electronic signal; and a signal processing circuit unit comprising a transistor, and the light-emitting device, the photodetector, and the signal processing circuit are formed over a same substrate.

An optical pick-up device comprises: an optical system for condensing a laser beam emitted from a light-emitting device to irradiate a record medium, and for introducing a reflected light from the record medium to a photodetector; and a base, the base comprises the light-emitting device capable of emitting a laser beam; the photodetector for receiving the reflected light from the record medium to convert the reflected light to an electric signal; and a signal processing circuit unit comprising a transistor, and the light-emitting device, the photodetector, and the signal processing circuit are integrally formed.

In the light-emitting device, an organic compound layer is formed between a pair of substrates. An emission spectrum of a light emitted from the organic compound layer has a plurality of emission peaks. The thickness of the organic compound layer is preferably controlled so as to form a stationary wave with respect to a specified wavelength. The organic compound layer is preferably formed to have a thickness of half of a specified wavelength or integral multiple of the half wavelength.

The light-emitting device may comprise an organic compound layer that emits light having a plurality of emission peaks. At least one of the emission peaks having a half bandwidth of at most 10 μm.

The light-emitting device used in an optical pick-up device according to the invention is realized to emit a laser beam. The light-emitting device can induce luminescence in addition to the laser beam. In order to couple out only a laser beam at a specified wavelength in order to utilize out-coupled light, an optical filter that transmits light at a specified wavelength may be used for the light-emitting device.

The number of components of the optical pick-up device can be reduced by forming integrally a light-emitting device formed by an organic compound material capable of emitting a laser beam; a photodetector; a control circuit formed by a thin film device such as a TFT; and the like over one substrate. As a result, the optical pick-up device can be miniaturized and lightweight.

These and other objects, features and advantages of the present invention will become more apparent upon reading of the following detailed description along with the accompanied drawings.

BRIEF DESCRIPTION OF THE INVENTION

DESCRIPTION OF THE INVENTION

An embodiment of the present invention will be explained with reference to the drawings. According to the embodiment, a light-emitting device capable of emitting a laser beam, a photodetector for receiving a laser beam to convert a light signal into an electronic signal, a switching element for controlling various signals corresponding to these devices, a power source circuit for supplying a current, and the like are formed integrally over a same substrate. By forming integrally such a plurality of devices, a power source circuit, and the like over one substrate, fewer components will be allowed. Accordingly, the miniaturization of an optical pick-up device can be realized.

A light-emitting device capable of emitting a laser beam is formed by the following organic compound material. By using the organic compound material, the light-emitting device can be formed to be thin. Moreover, it becomes possible that the light-emitting device can be formed integrally with a control circuit composed of a thin film transistor, and the like.

Figure 4:
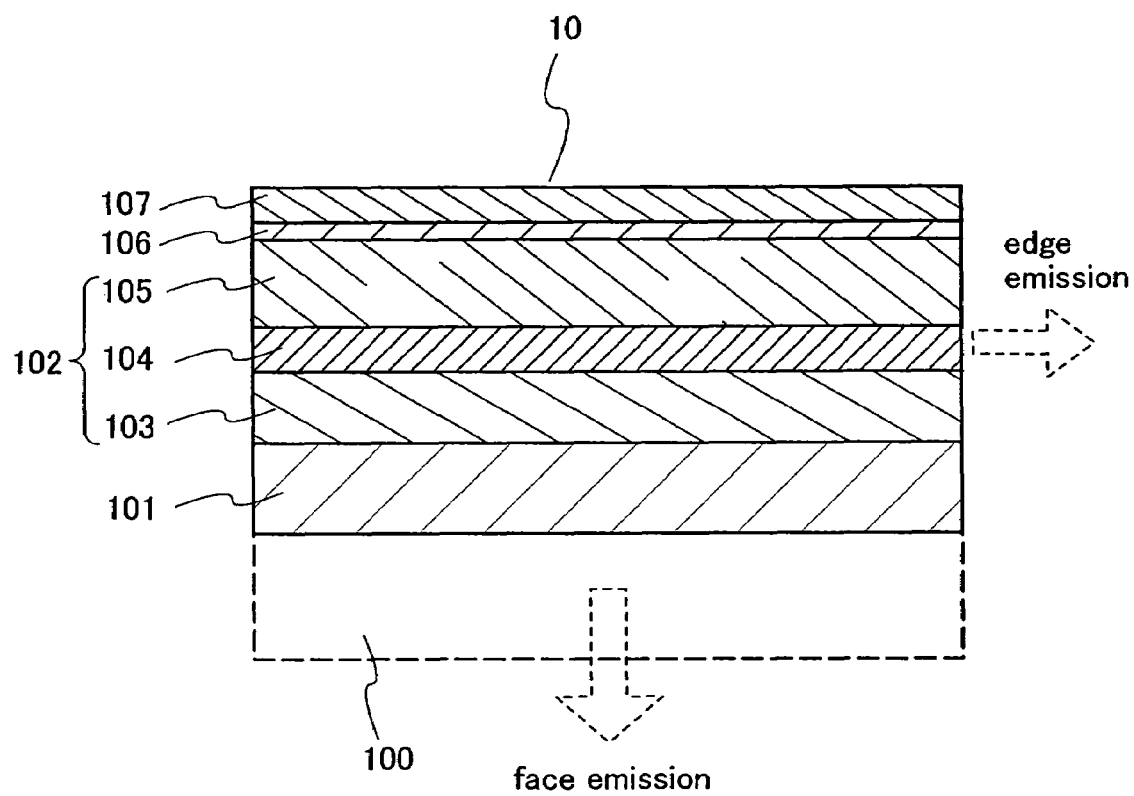
FIG. 4 is an explanatory view for showing a configuration of a light-emitting device used for an optical pick-up device according to the invention.

FIG. 4 is a cross-sectional view for showing one state of a light-emitting device 10 capable of producing electroluminescence and emitting laser beam. The light-emitting device is formed by stacking a first electrode 101, an organic compound layer 102, and a second electrode 107 over a substrate 101, sequentially. The organic compound layer 102 is composed of a hole transporting layer 103, a light-emitting layer 104, and an electron transporting layer 105. Further, a hole injecting layer may be formed between the first electrode and the hole transporting layer. An electron injecting layer may be formed between the electron transporting layer and the second electrode. FIG. 4 shows a state in which an electron injecting layer 106 is formed between the electron transporting layer 105 and the second electrode 107.

The first electrode 101 serves as an anode for applying a plus voltage. The anode serves as an electrode for injecting holes to the organic compound layer. Hence, a material having a large work function (at least 4.0 eV) is suitable for forming the anode. As the anode material that meets the foregoing requirement, a conductive oxide which is transparent to light such as ITO (Indium Tin Oxide), ZnO (Zinc Oxide), or TiN (Titanium Nitride); or nitrides can be used. Further, the first electrode 101 is required to serve as a reflecting mirror for confining light generated in the light-emitting layer to form a stationary wave. The first electrode 101 may be composed of a plurality of layers for dividing functions of an anode and a reflecting mirror. For example, the first electrode may be formed by stacking a thin film of a conductive oxide which is transparent to light as typified by an ITO and a thin film of a substance which as poor absorption properties for visible light, high reflection properties, and a conductive properties. As the conductive light reflector, Al (aluminum) or the like can be used. In case of forming the first electrode to have functions of both an anode and a reflector, Ag (silver) or (Pt) platinum can be used. Ag or Pt has work functions of at least 4.0 eV and can inject holes to an organic compound layer. At any rate, the reflecting mirror has preferably the reflectance of from approximately 50 to 95% in order to emit laser beam through the first electrode 101.

As the hole injection layer, a material with small ionization potential is used. For example, the material can be selected form the group consisting of a metal oxide, a low molecular organic compound, and a high molecular compound. As a metal oxide, a vanadium oxide, a molybdenum oxide, a ruthenium oxide, an aluminum oxide, and the like can be used. As the low molecular organic compounds, starburst amine typified by m-MTDATA, metallophthalocyanine typified by CuPc, and the like can be used. As the high molecular compounds, conjugated polymer such as polyaniline or polythiophene derivatives can be used. By using the foregoing materials as the hole injecting layer 63, a hole injecting barrier is reduced to inject holes effectively.

As the hole transporting layer, known materials such as aromatic amine can be preferably used. For example, 4,4'-bis[N-(1-naphthyl)-N-phenyl-amino]-biphenyl (abbreviated α-NPD), 4,4',4''-tris(N,N-diphenyl-amino)-triphenyl amine (abbreviated TDATA), or the like can be used. Alternatively, poly(vinyl carbazole) having excellent hole transportation properties as a high molecular material can be used.

As the light-emitting layer, a metal complex such as tris(8-quinolinolate) aluminum (abbreviated $Alq_3$), tris(4-methyl-8-quinolinolate) aluminum (abbreviated $Almq_3$), bis(10-hydroxybenzo[η]-quinolinato) beryllium (abbreviated $BeBq_2$), bis(2-methyl-8-quinolinolate)-(4-hydroxy-biphenylyl)-aluminum (abbreviated BAlq), bis [2-(2-hydroxyphenyl)-benzooxazolate] zinc (abbreviated $Zn(BOX)_2$), bis [2-(2-hydroxyphenyl)-benzothiazolate] zinc (abbreviated $Zn(BTZ)_2$), or the like can be used. Alternatively, various types of fluorescent dye can be used. Further, phosphorescent materials such as a platinum octaethylporphyrin complex, a tris(phenylpyridine)iridium complex, or a tris(benzylidene-acetonato)phenanthrene europium complex can be efficiently used. Since phosphorescent materials has longer excitation lifetime than that of fluorescent materials, population inversion, that is, the state in which the number of molecules in an excited state is larger that that in a ground state, becomes to be formed easily, which is essential to laser oscillation.

In addition, light-emitting materials can be used as dopant in the foregoing light-emitting layer 65. Therefore, a material having larger ionization potential and a band gap than those of light-emitting materials is used as a host material, and a small amount of the foregoing light-emitting material (approximately from 0.001 to 30%) can be mixed into the host material.

As the electron transporting layer, a metal complex having a quinoline skeleton or a benzoquinoline skeleton or a mixed ligand complex typified by tris(8-quinolinolate)aluminum (abbreviated $Alq_3$). Alternatively, an oxadiazole derivative such as 2-(4-biphenyl)-5-(4-tert-butylphenyl)-1,3,4-oxadiazole (abbreviated PBD), or 1,3-bis[5-(p-tert-butylphenyl)-1,3,4-oxadiazole-2-yl]benzene (abbreviated OXD-7), a triazole derivative such as 3-(4-tert-butylphenyl)-4-phenyl-5-(4-biphenylyl)-1,2,4-triazole (abbreviated TAZ), or 3-(4-tert-butylphenyl)-4-(4-ethylphenyl)-5-(4-biphenylyl)-1,2,4-triazole (abbreviated p-EtTAZ), phenanthroline derivatives such as bathophenanthroline (abbreviated BPhen), or bathocuproin (abbreviated BCP) can be used.

As an electron injection material, an alkali metal or alkaline earth metal salt such as calcium fluoride, lithium fluoride, or cesium bromide can be used. The electron injecting layer may be formed by these metal elements contained in another metal or an electron transportation material.

In case of forming the first electrode as an anode, the second electrode is formed as a cathode. The cathode may be formed by a metal material having comparatively a smaller work function (at least 4.0 eV) compared with that of an organic compound material, an alloy containing the metal material, or a compound material. Specifically, an element of group 1 or 2 in the periodic table, that is, an alkali metal such as Li, Cs, or the like; alkali earth metal such as Mg, Ca, Sr, or the like; an alloy containing the foregoing materials (Mg/Ag, Al/Li) can be used. Alternatively, a transition metal containing a rare earth metal can be used. The cathode can be formed by stacking a metal such as Al, Ag, or ITO (including alloys) over the foregoing materials. In addition, a light-emitting device according to this embodiment need to have a resonator structure. The resonator structure is formed by a reflection of a light between the anode and the cathode. Therefore, as a cathode material, a metal having poor absorption of visible light and high reflectance is preferably used. Specifically, Al (aluminum), Mg (magnesium), or an alloy of the Al or the Mg is preferably used. The cathode is required to have the thickness that does not transmit a light since the cathode is desired to have reflectance of almost 100%.

The foregoing organic materials can be applied with either wet or dry process. In case of using high molecular materials, spin coating, ink jetting, dip coating, printing, or the like is suitable. On the other hand, in case of using low molecular materials, not only dip coating or spin coating, but also vapor deposition can be used. The anode material and the cathode material may be applied with vapor deposition, sputtering, or the like.

An important matter for the light-emitting device is an interval between the anode and the cathode, or between the reflector over the anode and the cathode. Therefore, the thickness of the organic compound layer is an important matter. In order to emit a laser beam, the interval is required to be integral multiple of a half wavelength to amplify a light by forming a stationary wave. For example, in order to amplify light at 400 nm, an interval at least 200 nm is required. Similarly, in order to amplify light at 800 nm, an interval of 400 nm is required. The emission wavelength of the foregoing organic light-emitting materials is mainly in a visible light region. Therefore, in order to amplify the visible light defined as from 400 to 800 nm, the interval between the reflector and the cathode 48, that is, the thickness of a functional layer is required to be at least 200 nm. In addition, since it should consider that an optical fiber is less for the refraction index of a material, it is required that the value obtained by dividing the thickness by a refraction index is at least 200 nm.

The foregoing each layer is formed over a substrate 100 formed by glass or quartz, or plastic such as acrylic or polycarbonate. By covering these layers by a protective layer, a solid state light-emitting device capable of emitting a laser beam.

An example of a light source capable of applying to this embodiment is explained in detail hereinafter. Further, the following explanation is described with reference to FIG. 4.

As a substrate 100 for forming a film such as an electrode or a light-emitting layer, a glass substrate such as commercially available alumino silicate glass, barium borosilicate glass, and the like are preferably used. Over the glass substrate, an ITO film is formed by sputtering to have a thickness of from 30 to 100 nm as the first electrode (anode) 101.

As the hole transporting layer 103, 4,4'-bis[N-(1-naphthyl)-N-phenyl-amino]-biphenyl (NPB) is deposited by vacuum vapor deposition. As the light-emitting layer 104, 4,4'-bis(N-carbazolyl)-biphenyl (CBP) as a host material and an iridium complex, and $Ir(tpy)_2(acac)$ as a triplet light-emitting material are deposited by co-evaporation. The weight ratio of the CBP and the iridium complex is 10:1. The electron transporting layer 105 is formed thereover by bathocuproin (BCP). The electron injecting layer 106 is formed by calcium fluoride ($CaF_2$). The second electrode 107 is formed by Al (aluminum) by vapor deposition.

The film thickness of each layer formed by organic materials is determined so as to amplify a light generated in an organic compound layer. Therefore, the light emission from the Ir complex, which is added to the light-emitting layer 104, or the light emission from the hole transporting layer 103 preferably form a stationary wave by repeating reflection at the interface between the first electrode 101 and the organic compound layer 102, the interface between the electron transporting layer 105 and the electron injecting layer 106, or the interface between the electron injecting layer 106 and the second electrode 107.

Materials capable of emitting light are the Ir complex and the NPB in the organic materials used here. These materials give light emission in a visible light region (400 to 800 nm). In order to form a stationary wave, the intervals between reflective surfaces are required to be the integral multiple of a half wavelength. For example, in order to form a stationary wave of 400 nm, the intervals are required to be 200 nm or the integral multiple thereof. That is, the thicknesses are required to be integral multiple of 200 nm, such as 200, 400, or 600 nm. Similarly, in order to form a stationary wave of light at 800 nm, the intervals between the reflective surfaces, that is, the thicknesses are required to be integral multiple of 400 nm, such as 400, 800, or 1200 nm.

By way of example, the hole transporting layer 103 is formed to have a thickness of 135 nm, the light-emitting layer 104 is formed to have a thickness of 30 nm, and the electron transporting layer 105 is formed to have a thickness of 105 nm. As a result, the organic compound layer is formed to have a thickness of 270 nm in total. In this case, given that the refractive index of organic compound layer is 1.7, the wavelength of light capable of forming a stationary wave is the one that is divided 920 nm by integer, that is, 460 nm in a visible light region.

Figure 5A:
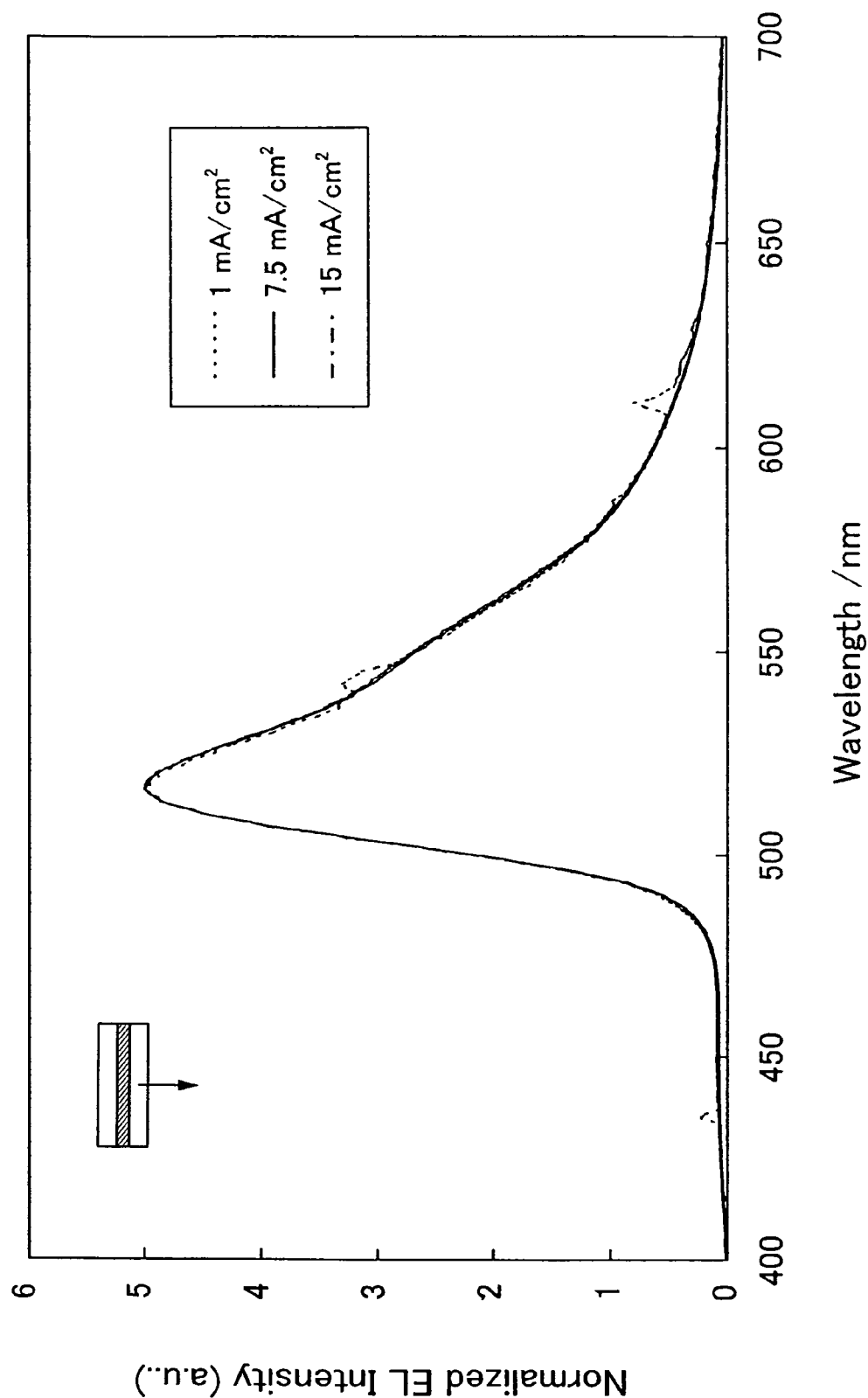
FIGS. 5A and 5B are graphs for showing current density dependency, which is normalized by a maximum value of emission intensity, of an emission spectrum of light emitted from a light-emitting device having the configuration shown in FIG. 4.
Figure 5B:
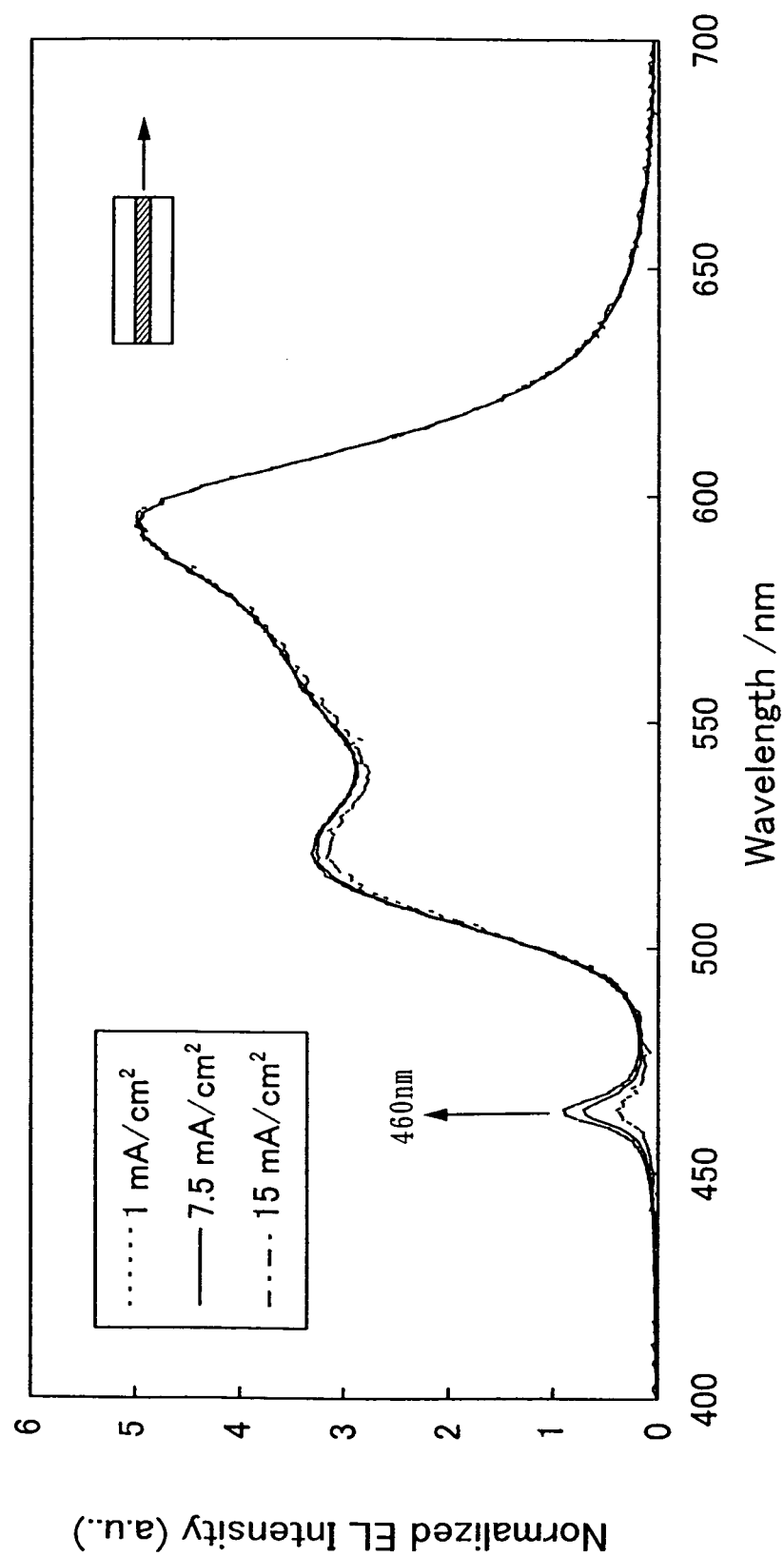

FIGS. 5A and 5B show emission spectrums of a thus obtained light source. Light emission is obtained by applying direct voltage to a pair of electrodes so that the first electrode serves as an anode and the second electrode serves as a cathode. Light emission can be observed around 6 V. Light emission of tens of thousands candela (Cd) is obtained at applied voltage of 24 V.

In both spectra shown in FIGS. 5A and 5B, a longitudinal axis represents normalized emission intensity. FIG. 5A shows an emission spectrum of a face emission observed from the side of the first electrode. FIG. 5B shows an emission spectrum of an edge emission observed from a lateral side of the substrate provided with a laminated organic compound layer. As shown in FIG. 5A, intense emission is observed in a wavelength band of from 475 to 650 nm. The emission is produced from the Ir complex.

The measurement shows that carriers (holes and electrons) are recombined each other almost always in the light-emitting layer 104 to excite the light emission from the Ir complex; however, some carriers are recombined in the hole transporting layer 103. In case of the face emission, emission intensity varies depending on the variation of a current density. Therefore, the spectra at any current density become to have identical forms, and only the intensity is increased linearly in proportion to the increase of a current density.

Compared to the spectrum shown in FIG. 5A, the spectrum of the edge emission in FIG. 5B has two features. The first feature is that the waveform of an emission spectrum in the wavelength band of from 475 to 650 nm is different from that in FIG. 5A. The second feature is that a sharp emission spectrum is observed around 460 nm in FIG. 5B. The reason of the former is not clear. On the contrary, the reason of the latter may be considered that a stationary wave is formed by the organic compound layer 102, and only the light emission at the wavelength is amplified. Actually, as mentioned above, the wavelength that allows stationary wave is 460 nm in the thickness of the organic compound layer 102. As the most characteristic feature, the intensity of the emission in the wavelength band of from 475 to 600 nm varies in proportion to the increase of a current density, on the contrary, the intensity of another emission spectrum having a peak at around 460 nm further increases than the increase of a current density. Therefore, in the normalized intensity shown in FIG. 5B, only emission at 460 nm is relatively increased.

Therefore, the measurement shows that the structure of the light-emitting device serves as a resonator of light at 460 nm to amplify the light.

Hereinafter, an optical pick-up device using the light-emitting device capable of emitting a laser beam is explained.

Figure 1:
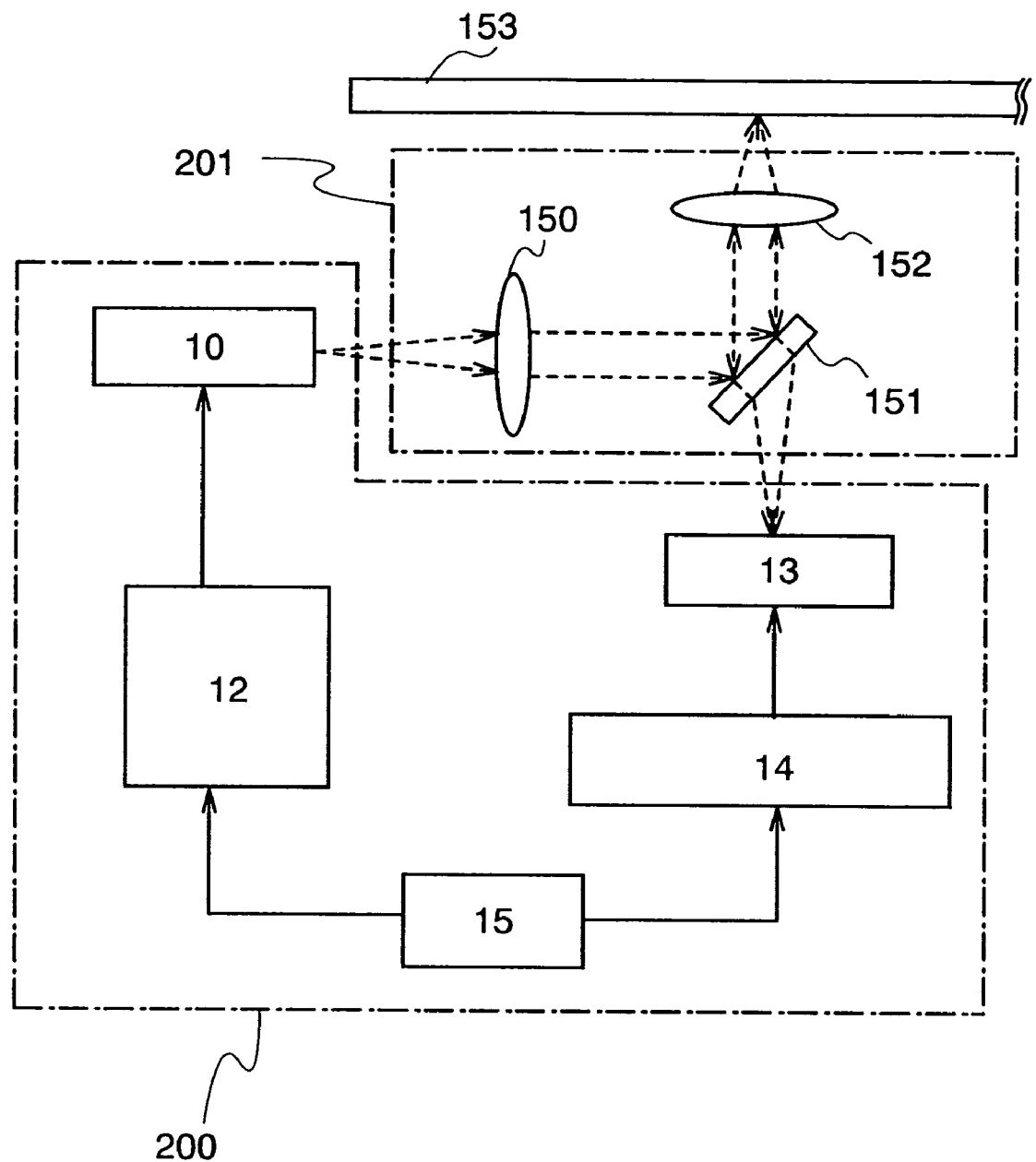
FIG. 1 is an explanatory view for showing a structure of an optical pick-up device according to the present invention.

FIG. 1 is an explanatory view for showing the structure of an optical pick-up device according to the present invention. A light-emitting device 10, which is formed by stacking a thin film, capable of emitting laser beam; a first control circuit 12 for controlling a light-emitting device; a photodetector 13; a second control circuit 14 for reading the signal for a photodetector; and a power source circuit 15 are integrally formed over a base 200. The first and the second control circuits are formed to be an integrated circuit by an MOS transistor or a thin film transistor (TFT) using an amorphous or crystalline semiconductor film. Of course, a part of the circuit integrally formed over a semiconductor chip may be mounted over the substrate 200.

An optical system 201 composed of a collimator lens 150, a mirror 151, an objective lens 152, and the like may have the structure in which a laser beam emitted from the light-emitting device 10 is condensed, and an optical record medium 153 such as an optical dick is irradiated with the condensed light, subsequently, light reflected from the optical record medium 153 is received by the photodetector 13. The optical system 201 is not limited to that shown in FIG. 1A. The optical system 201 is formed separately from a base 200; however, the optical system 201 is preferably integrated with the base 200 by putting into a casing in the event.

Figure 2A:
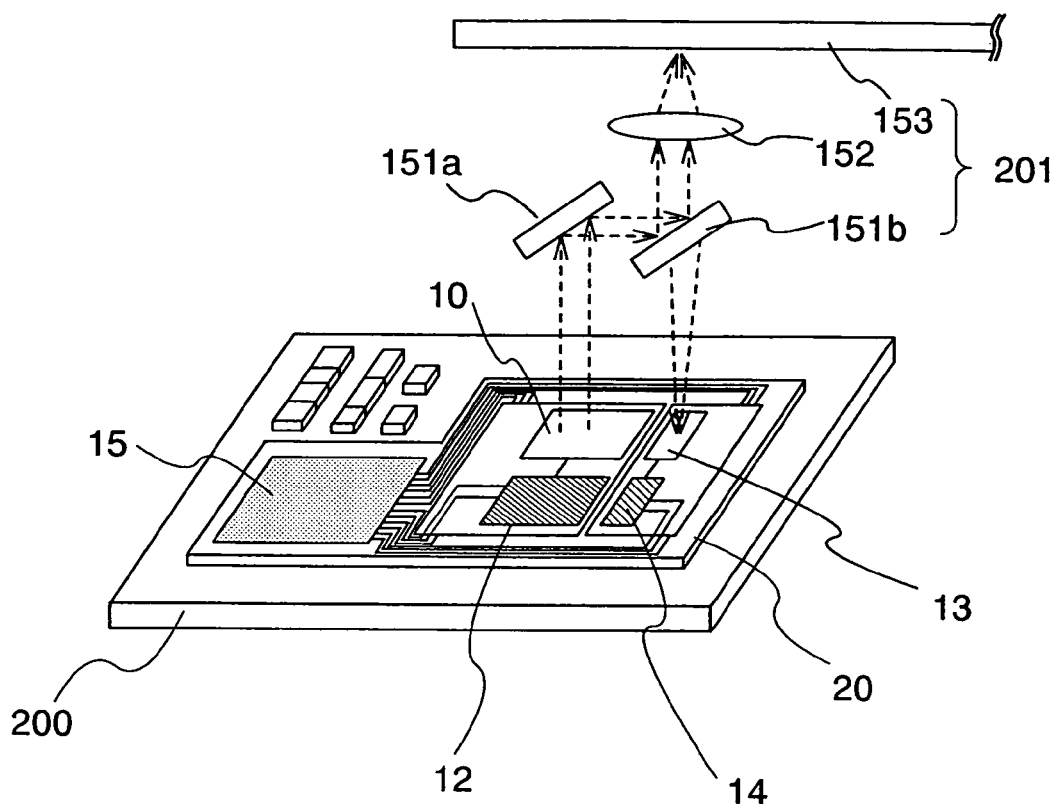
FIGS. 2A and 2B are perspective views for showing a state in which a light-emitting device, a photodetector, and a control circuit, each of which is formed over a same substrate, are formed over a same base.

FIG. 2A shows an optical pick-up device showing the structure that the light-emitting device 10, the first control circuit 12, the photodetector 13, the second control circuit 14, and the power source circuit 15 are integrated over the substrate 20 that is provided over the base 20. The optical system 201 such as the mirrors 151a, 151b, the objective lens 152, and the like is arranged between the optical pick-up device and the optical record medium 153.

Figure 2B:
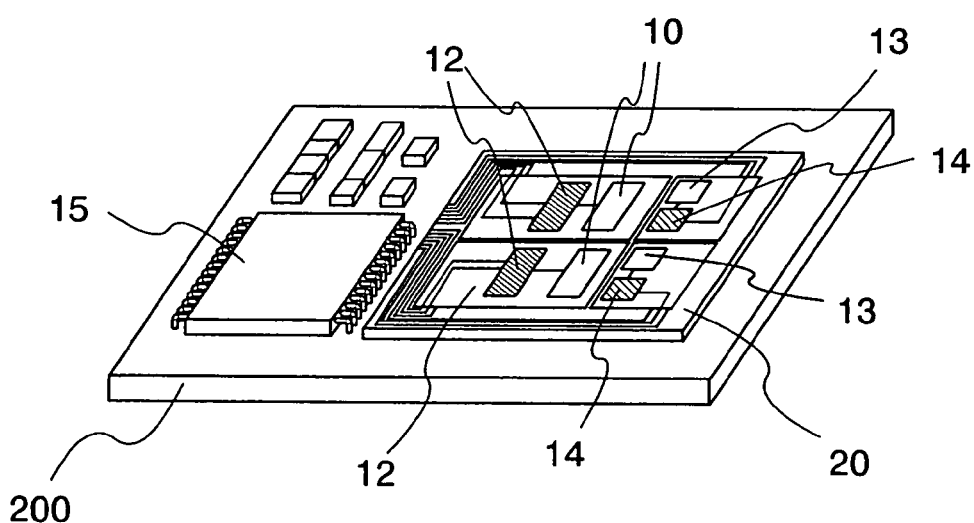

FIG. 2B is a view for showing that the power source circuit 15 is mounted over the base 200 as an independent integrated circuit component. As shown in FIG. 2B, a plurality of the light-emitting devices 10, a plurality of the first control circuit 12, a plurality of the photodetector 13, and a plurality of the second control circuit 14 can be provided. Accordingly, the optical pick-up device can respond to a readout method using a plurality of beams such as a three beams method. Specifically, the optical pick-up device can respond to a three beams method (one main beam and two sub beams) for reproducing an optical disk such as a compact disk and a single beam method for reproducing a DVD (Digital Versatile Disc). Hence, the optical pick-up device can obtain compatibility with the optical record medium.

The light-emitting device 10, the photodetector 13, the first control circuit 12, and the second control circuit 14 can be formed by appropriately stacking a thin film having conductive properties, semiconductive properties, and insulating properties. The light-emitting device 10 comprises an organic compound layer capable of emitting laser beam. The light-emitting device having the foregoing structure can be utilized.

The photodetector 13 is formed by an amorphous semiconductor film (such as an amorphous silicon film) or a crystalline semiconductor film (such as a polycrystalline silicon film). Further, the photodetector 13 is formed to have a photoelectric conversion function having a structure of a pin junction, nin junction, pip junction, schottky barrier, or the like. A semiconductor layer for forming a junction is formed to have a thickness of approximately 1 μm. An electrode facing incident light may be formed by a conductive film transparent to light such as ITO. Another electrode may be formed by a metal material such as Al.

As an element for forming the first control circuit 12 and the second control circuit 14, a switching element in addition to a resistance element and a capacity element is formed by using a transistor. A typical form of a transistor is a thin film transistor using an amorphous semiconductor film or a crystalline semiconductor film. The thin film transistor can be formed over the substrate 20 formed by glass or plastics. In case of using a single crystalline substrate such as a silicon wafer or an SOI (Silicon On Insulator) substrate for the substrate 20, a control circuit can be formed by an MOS transistor.

Figure 3A:
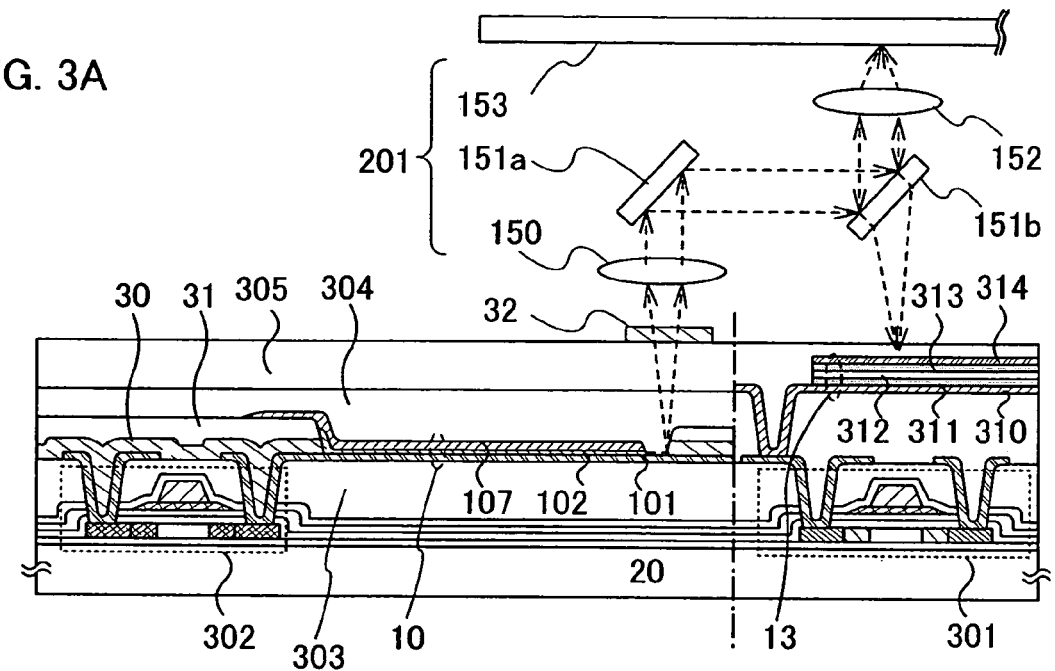
FIGS. 3A to 3C are cross-sectional views for showing a state in which a light-emitting device, a photodetector, and a control circuit are integrally formed over a same substrate.
Figure 3B:
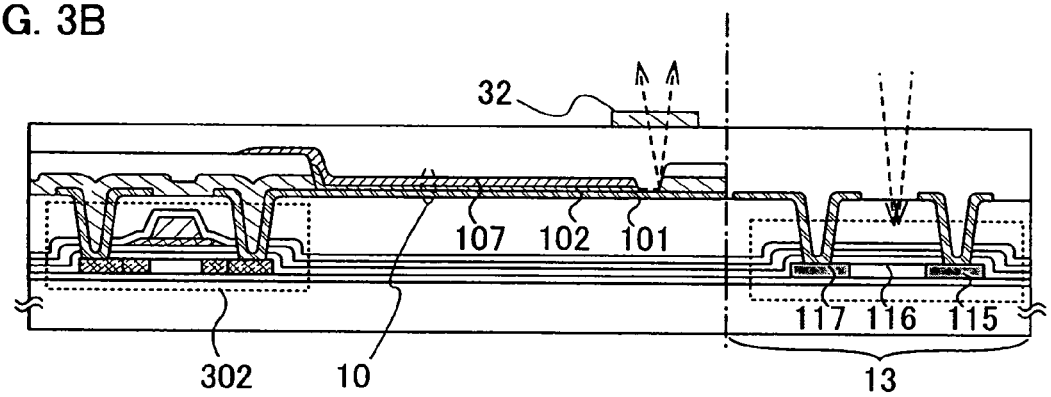
Figure 3C:
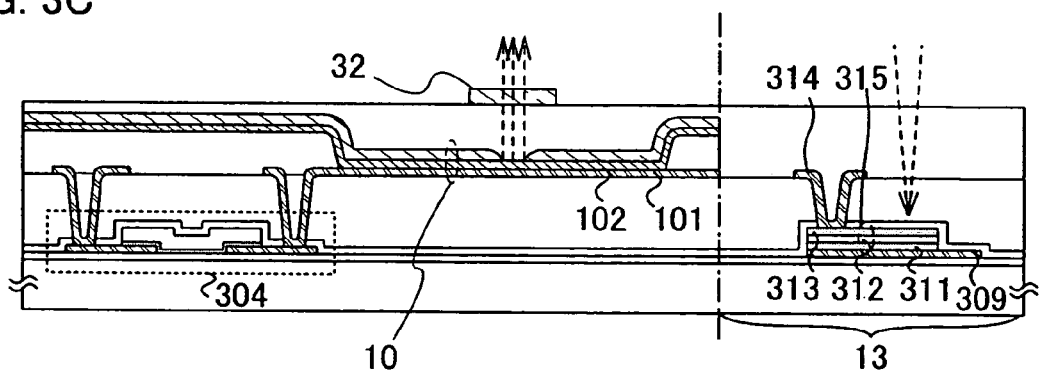

The foregoing each component can be integrally formed by stacking over one substrate. FIGS. 3A to 3C show one mode in which these components are integrally formed over the substrate 20.

In FIG. 3A, a substrate having an insulating surface such as a glass substrate of alumino-silicate glass, barium borosilicate glass, or the like; a quartz substrate; a plastic substrate of acrylic, polycarbonate, or the like, can be used as the substrate 20. Alternatively, a single crystalline semiconductor substrate such as a silicon wafer can be is used in addition to an SOI substrate.

The light-emitting device 10 and the photodetector 13 can be formed integrally over the substrate 20. Thin film transistors 301, 302 for controlling these devices are formed by a crystalline semiconductor film or an amorphous semiconductor film. FIG. 3A shows a top gate thin film transistor. The light-emitting device 10 is formed over the thin film transistors 301, 302 via a first interlayer insulating film 303. The photodetector 13 is formed over the thin film transistors 301, 302 via a second interlayer insulating film 304. The light-emitting device 10 and the photodetector 13 connect to each thin film transistor.

The light-emitting device 10 is formed by stacking a first electrode 101, an organic compound layer 102, and a second electrode 107. The first electrode 101 is preferably formed by stacking a plurality of conductive films in order to connect to the thin film transistor 302. As a preferable mode, the first electrode is composed of a first conductive film formed by titanium (Ti) for forming a semiconductor film and a contact of the thin film transistor; a second conductive film formed by aluminum (Al); and a third conductive film formed by titanium nitride (TiN). A material for forming the first electrode 101 is not limited thereto. The conductive film of a top layer is preferably formed by an appropriately selected material as hereinafter described so as to serve as either electrode of the light-emitting device 10.

An Al film 30 and an insulating film 31 formed by an inorganic material or an organic material are formed over the first electrode 101. A bank having an opening portion is formed by selectively etching the Al film 30 and the insulating film 31. The edge of the opening portion is preferably etched to have an angle of gradient of approximately 45°. Then, a mirror surface is formed by exposing the surface of the Al film 30.

The organic compound layer 102 and the second electrode 107 are formed over the first electrode 101 for covering thus formed opening portion of the bank. Further, as shown in FIG. 3A, the side of the organic compound layer 102 is exposed by etching a portion of the edge of the organic compound layer 102 and the second electrode 107.

According to the foregoing structure, the organic compound layer 102 is formed to have a thickness of half (half wavelength) of a specified wavelength. Accordingly, light emission reflects between the first electrode 101 and the second electrode 107, by which a stationary wave of light at the wavelength can be formed. Therefore, a stationary wave of a light at the wavelength can be formed by forming a resonator structure, which makes it possible to emit laser beam.

As light emitted from the organic compounds, a laser beam having a narrow half band width at a specified wavelength and luminescence in other wavelength band may be emitted simultaneously. In order to remove the luminescence, an optical filter 32 capable of transmitting selectively light at a specified wavelength is provided over a optical path of a laser beam.

The photodetector 13 can be formed over an insulating surface on which the light-emitting device 10 is formed. Further, the photodetector 13 can be formed over either surface of the interlayer insulating film. The light-emitting device 10 and the photodetector 13 may be arranged depending on the relative positional relationship between these devices and the optical system 201.

FIG. 3A shows an example in which the photodetector 13 is formed over the second interlayer insulating film 304. For example, a wiring 310 is formed as either electrode for connecting to the thin film transistor 301. An n-type semiconductor layer 311, a semiconductor layer 312 capable of photoelectric conversion, and a p-type semiconductor layer 313 are sequentially stacked over the wiring 301. Note that the sequence of lamination of the n-type semiconductor layer 311 and the p-type semiconductor layer 313 may be reversed. Therefore, a pin junction photoelectric conversion layer is formed. An upper electrode 314 may be formed by ITO.

FIG. 3B shows an example in which the photodetector 13 is formed over a semiconductor layer on which the TFT 302 is formed. The photodetector 13 can be formed by a crystalline semiconductor film as typified by a polycrystalline silicon crystallized by laser annealing. The photodetector 13 is composed of a semiconductor region 116 capable of photoelectric conversion interposed between a p-type semiconductor region 115 and an n-type semiconductor region 117.

FIG. 3C shows one mode in which the TFT 304 formed by an amorphous semiconductor film; a photoelectric conversion layer 315 formed by stacking the n-type semiconductor 311, a semiconductor layer 312 capable of photoelectric conversion, a p-type semiconductor layer 313, and an upper electrode 314 comprising ITO over the electrode 309 serving as either electrode. Note that the sequence of lamination of the n-type semiconductor 311 and the p-type semiconductor layer 313 may be reversed.

According to this embodiment, the control circuit using a TFT, the light-emitting device 10, and the photodetector 13 can be integrally formed over the substrate 20. An optical pick-up device can be formed by combining the substrate 20 and the optical system.

By utilizing the optical pick-up device having thus formed structure, a computer, a video reproduction device, and another electric appliance can be completed.

Figure 6A:
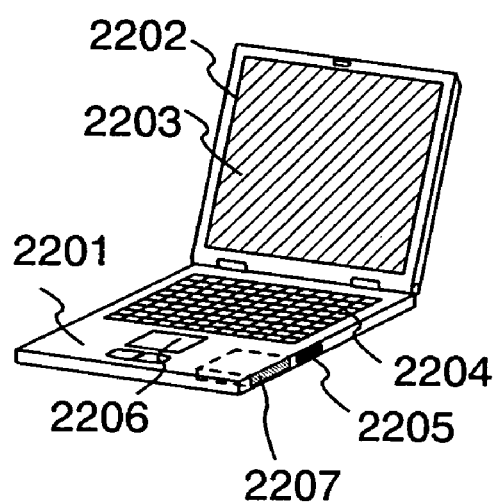
FIGS. 6A and 6B shows examples of electric appliances completed by an optical pick-up device according to the invention.

FIG. 6A shows an example of completing a computer by practicing the present invention. The computer is composed of a main body 2201, a casing 2202, a display portion 2203, a keyboard 2204, an external connection port 2205, a pointing mouse 2206, and a CD-R/RW drive 2207. The optical pick-up device according to the invention can be used for the CD-R/RW drive 2207. The optical pick-up device has the structure in which the foregoing light-emitting device and TFT are formed over the substrate. A thin, lightweight, and highly portable computer can be completed.

Figure 6B:
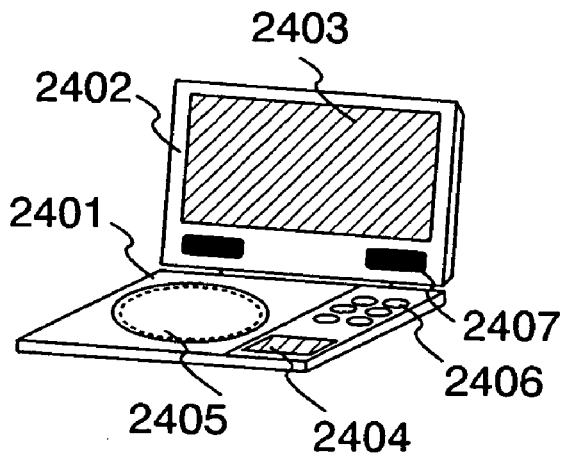

FIG. 6B shows an example of completing a video reproduction device (DVD player) by practicing the invention. The video reproduction device is composed of a 5 main body 2401, a casing 2402, a display portion A 2403, a display portion B 2404, a record medium readout unit 2405, operation keys 2406, speaker portions 2407, and the like. A thin, lightweight, and highly portable video reproduction device can be completed by utilizing the optical pick-up device according to the invention for the record medium readout unit 2405.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. An optical pick-up device comprising:
   a light-emitting device capable of emitting a laser beam;
   an optical system;
   a photodetector for converting a light to an electronic signal; and
   a signal processing circuit unit comprising a transistor,
   wherein the light-emitting device comprises an organic compound layer formed between a pair of substrates, and
   wherein the light-emitting device, the photodetector, and the signal processing circuit are formed over a same substrate.

11

2. An optical pick-up device according to claim 1,
wherein an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

3. An optical pick-up device according to claim 1,
wherein the organic compound layer emits a light having a plurality of emission peaks, at least one of the emission peaks having a half band width of at most 10 μm.

4. An optical pick-up device according to claim 1,
wherein the light-emitting device is provided with an optical filter, which transmits a light at a specified wavelength, at a light output side.

5. An optical pick-up device according to claim 1,
wherein the optical pick-up device is incorporated into a computer or a video reproduction device.

6. An optical pick-up device comprising:
an optical system; and
a base, the base comprising:
   a light-emitting device capable of emitting a laser beam;
   a photodetector for converting a light to an electric signal; and
   a signal processing circuit unit comprising a transistor,
wherein the light-emitting device comprises an organic compound layer formed between a pair of substrates, and
wherein the light-emitting device, the photodetector, and the signal processing circuit are integrally formed.

7. An optical pick-up device according to claim 6,
wherein an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

8. An optical pick-up device according to claim 6,
wherein the organic compound layer emits a light having a plurality of emission peaks, at least one of the emission peaks having a half band width of at most 10 μm.

9. An optical pick-up device according to claim 6,
wherein the light-emitting device is provided with an optical filter, which transmits a light at a specified wavelength, at a light output side.

10. An optical pick-up device according to claim 6,
wherein the optical pick-up device is incorporated into a computer or a video reproduction device.

11. An optical pick-up device comprising:
a first thin film transistor;
a second thin film transistor;
a light-emitting device capable of emitting a laser beam, the light emitting device electrically connected to the first thin film transistor;
a photodetector for converting a light to an electronic signal, the photodetector electrically connected to the second thin film transistor; and
a signal processing circuit unit comprising a third thin film transistor,
wherein the first, second, and third thin film transistors are formed on a same surface.

12

12. An optical pick-up device according to claim 11,
wherein the light-emitting device comprises an organic compound layer formed between a pair of substrates, an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

13. An optical pick-up device according to claim 11,
wherein the light-emitting device comprises an organic compound layer which emits a light having a plurality of emission peaks, at least one of the emission peaks having a half band width of at most 10 μm.

14. An optical pick-up device according to claim 11,
wherein the light-emitting device is provided with an optical filter, which transmits a light at a specified wavelength, at a light output side.

15. An optical pick-up device according to claim 11,
wherein the optical pick-up device is incorporated into a computer or a video reproduction device.

16. An optical pick-up device comprising:
a light-emitting device capable of emitting a laser beam;
a photodetector for receiving a reflected light from a record medium to convert the reflected light to an electric signal, wherein the reflected light is formed by an irradiation the laser beam from the light-emitting device to the record medium; and
a signal processing circuit unit comprising a transistor,
wherein the light-emitting device comprises an organic compound layer formed between a pair of substrates, and
wherein the light-emitting device, the photodetector, and the signal processing circuit are formed over a same substrate.

17. An optical pick-up device according to claim 16,
wherein an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

18. An optical pick-up device according to claim 16,
wherein the organic compound layer emits a light having a plurality of emission peaks, at least one of the emission peaks having a half band width of at most 10 μm.

19. An optical pick-up device according to claim 16,
wherein the light-emitting device is provided with an optical filter, which transmits a light at a specified wavelength, at a light output side.

20. An optical pick-up device according to claim 16,
wherein the optical pick-up device is incorporated into a computer or a video reproduction device.

21. An optical pick-up device comprising:
a light-emitting device capable of emitting a laser beam;
an optical system for condensing the laser beam emitted from the light-emitting device to irradiate a record medium, and for introducing a reflected light from the record medium to a photodetector;
the photodetector for receiving the reflected light from the record medium to convert the reflected light to an electronic signal; and
a signal processing circuit unit comprising a transistor, wherein the light-emitting device comprises an organic compound layer formed between a pair of substrates, and wherein the light-emitting device, the photodetector, and the signal processing circuit are formed over a same substrate.

22. An optical pick-up device according to claim 21, wherein an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

23. An optical pick-up device according to claim 21, wherein the organic compound layer emits a light having a plurality of emission peaks, at least one of the emission peaks having a half band width of at most 10 µm.

24. An optical pick-up device according to claim 21, wherein the light-emitting device is provided with an optical filter, which transmits a light at a specified wavelength, at a light output side.

25. An optical pick-up device according to claim 21, wherein the optical pick-up device is incorporated into a computer or a video reproduction device.

26. An optical pick-up device comprising:

an optical system for condensing a laser beam emitted from a light-emitting device to irradiate a record medium, and for introducing a reflected light from the record medium to a photodetector; and a base, the base comprising:

the light-emitting device capable of emitting a laser beam;

the photodetector for receiving the reflected light from the record medium to convert the reflected light to an electric signal; and a signal processing circuit unit comprising a transistor, wherein the light-emitting device comprises an organic compound layer formed between a pair of substrates, and wherein the light-emitting device, the photodetector, and the signal processing circuit are integrally formed.

27. An optical pick-up device according to claim 26, wherein an emission spectrum of a light emitted from the organic compound layer has a plurality of emission peaks, and the organic compound layer is formed to have a thickness of half of a specified wavelength or integral multiple of the specified wavelength so as to form a stationary wave with respect to the specified wavelength.

28. An optical pick-up device according to claim 26, wherein the organic compound layer emits a light having a plurality of emission peaks, at least one of the emission peaks having a half band width of at most 10 µm.

29. An optical pick-up device according to claim 26, wherein the light-emitting device is provided with an optical filter, which transmits a light at a specified wavelength, at a light output side.

30. An optical pick-up device according to claim 26, wherein the optical pick-up device is incorporated into a computer or a video reproduction device.

\* \* \* \* \*